(12) United States Patent
Miyamoto et al.

(10) Patent No.: US 9,324,630 B2
(45) Date of Patent: Apr. 26, 2016

(54) SEMICONDUCTOR DEVICE

(75) Inventors: Noboru Miyamoto, Tokyo (JP); Masao Kikuchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/357,669

(22) PCT Filed: Feb. 14, 2012

(86) PCT No.: PCT/JP2012/053375
§ 371 (c)(1),
(2), (4) Date: May 12, 2014

(87) PCT Pub. No.: WO2013/121521
PCT Pub. Date: Aug. 22, 2013

(65) Prior Publication Data
US 2015/0108629 A1  Apr. 23, 2015

(51) Int. Cl.
*H01L 23/473* (2006.01)
*H01L 23/36* (2006.01)
*H01L 23/433* (2006.01)
*H01L 23/495* (2006.01)
*H01L 23/29* (2006.01)
(Continued)

(52) U.S. Cl.
CPC ............ *H01L 23/473* (2013.01); *H01L 23/29* (2013.01); *H01L 23/36* (2013.01); *H01L 23/40* (2013.01); *H01L 23/4334* (2013.01); *H01L 23/49562* (2013.01); *H01L 23/3107* (2013.01); *H01L 2224/48091* (2013.01); *H01L 2224/48247* (2013.01); *H01L 2924/1305* (2013.01); *H01L 2924/13055* (2013.01)

(58) Field of Classification Search
CPC ...................................................... H01L 23/46
See application file for complete search history.

(56) References Cited

U.S. PATENT DOCUMENTS

| 2004/0096584 | A1 | 5/2004 | Naruskevicius et al. |
| 2006/0055056 | A1* | 3/2006 | Miura et al. ............... 257/779 |

(Continued)

FOREIGN PATENT DOCUMENTS

| JP | 2001-250890 A | 9/2001 |
| JP | 2005-064131 A | 3/2005 |

(Continued)

OTHER PUBLICATIONS

Notification of Transmittal of Translation of the International Preliminary Report on Patentability and Translation of Written Opinion of the International Searching Authority; PCT/JP2012/053375; issued on Aug. 28, 2014.

(Continued)

*Primary Examiner* — Matthew Reames
*Assistant Examiner* — Steven B Gauthier
(74) *Attorney, Agent, or Firm* — Studebaker & Brackett PC

(57) ABSTRACT

A cooling fin 9 is joined to a semiconductor element 1. A resin 10 encapsulates the semiconductor element 1. A portion of the cooling fin 9 projects from a lower surface of the resin 10. A cooler 11 has an opening 12. The cooling fin 9 projecting from the resin 10 is inserted in the opening 12 of the cooler 11. The lower surface of the resin 10 and the cooler 11 are joined to each other by a joining material 13 such as an adhesive. Therefore, a reduction in the number of component parts and a reduction in weight can be achieved, and compatibility between the heat conductivity and the strength of joining can be ensured.

7 Claims, 2 Drawing Sheets

(51) Int. Cl.
   *H01L 23/40*   (2006.01)
   *H01L 23/31*   (2006.01)

(56) References Cited

U.S. PATENT DOCUMENTS

| | | |
|---|---|---|
| 2006/0067059 A1 | 3/2006 | Ushijima et al. |
| 2009/0321924 A1* | 12/2009 | Funakoshi et al. ............ 257/722 |
| 2010/0282459 A1* | 11/2010 | Leonhardt ..................... 165/185 |
| 2011/0304039 A1* | 12/2011 | Miyamoto .................... 257/712 |
| 2012/0001318 A1* | 1/2012 | Mamitsu et al. .............. 257/713 |

FOREIGN PATENT DOCUMENTS

| | | |
|---|---|---|
| JP | 2006-310363 A | 11/2006 |
| JP | 2007-184315 A | 7/2007 |
| JP | 2009-064870 A | 3/2009 |
| JP | 2010-010504 A | 1/2010 |
| JP | 2010-177529 A | 8/2010 |
| JP | 4583122 B2 | 9/2010 |
| JP | 2012-004218 A | 1/2012 |

OTHER PUBLICATIONS

International Search Report; PCT/JP2012/053375; May 29, 2012.
An Office Action issued by the German Patent Office on Jul. 13, 2015, which corresponds to German Patent Application No. 112012005867.4 and is related to U.S. Appl. No. 14/357,669; with English language partial translation.

* cited by examiner

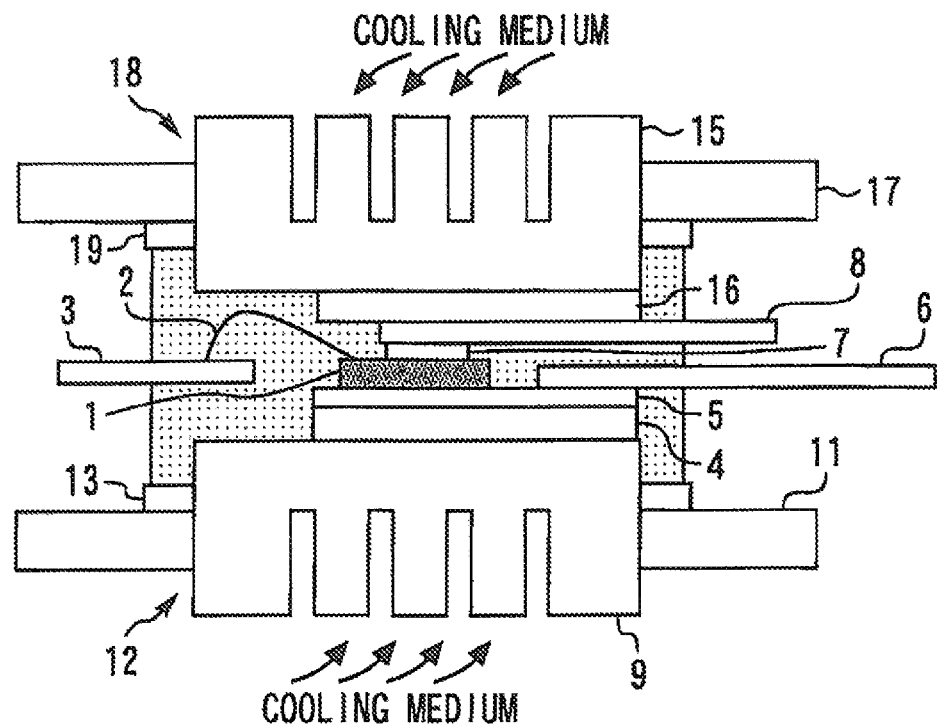
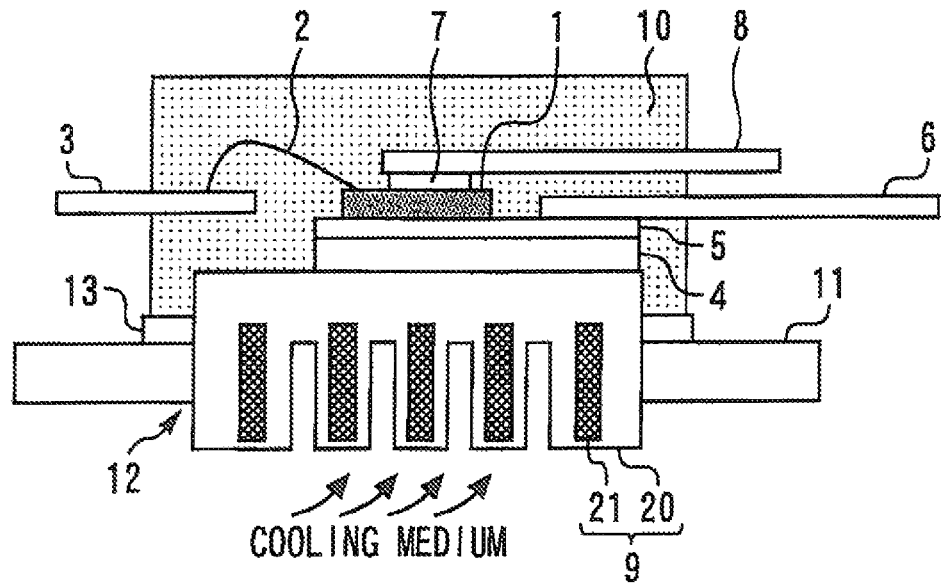

SEMICONDUCTOR DEVICE

TECHNICAL FIELD

The present invention relates to a semiconductor device wherein a resin-molded semiconductor package is jointed to a cooling device.

BACKGROUND ART

Conventional package-type power modules need gel encapsulation of semiconductor elements. A large number of assembly process steps and high parts cost are required for such power modules. Power modules having semiconductor elements transfer-molded are therefore being developed (see, for example, Patent Literature 1). A resin-molded semiconductor package needs to be fixed on a cooling device in order to be cooled, and a method of fixing such a semiconductor package by using screws or the like has been proposed (see, for example, Patent Literature 2).

CITATION LIST

Patent Literature

Patent Literature 1: Japanese Patent Laid-Open No. 2001-250890
Patent Literature 2: Japanese Patent No. 4583122

SUMMARY OF INVENTION

Technical Problem

With the method of fixing by using screws or the like, there is a problem that the number of component parts is increased and the overall weight is increased. On the other hand, methods of joining a semiconductor package to a cooling device without using screws or the like are being studied. However, no success has been achieved in ensuring compatibility between the heat conductivity and the strength of joining since the cooling portion and the joint coincide with each other.

The present invention has been made to solve the above-described problems, and an object thereof is to provide a semiconductor device which can ensure compatibility between the heat conductivity and the strength of joining and achieve a reduction in the number of component parts and a reduction in weight.

Means for Solving the Problems

A semiconductor device according to the present invention includes a semiconductor element; a cooling body joined to the semiconductor element; a resin encapsulating the semiconductor element; and a cooler having an opening, wherein a portion of the cooling body projects from a main surface of the resin, the cooling body projecting from the resin is inserted in the opening of the cooler, and the main surface of the resin and the cooler are joined to each other by a joining material.

Advantageous Effects of Invention

The present invention makes it possible to ensure compatibility between the heat conductivity and the strength of joining and achieve a reduction in the number of component parts and a reduction in weight.

BRIEF DESCRIPTION OF THE DRAWINGS

FIG. 3 is a sectional view of a semiconductor device according to Embodiment 3 of the present invention.
FIG. 4 is a sectional view of a semiconductor device according to Embodiment 4 of the present invention.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
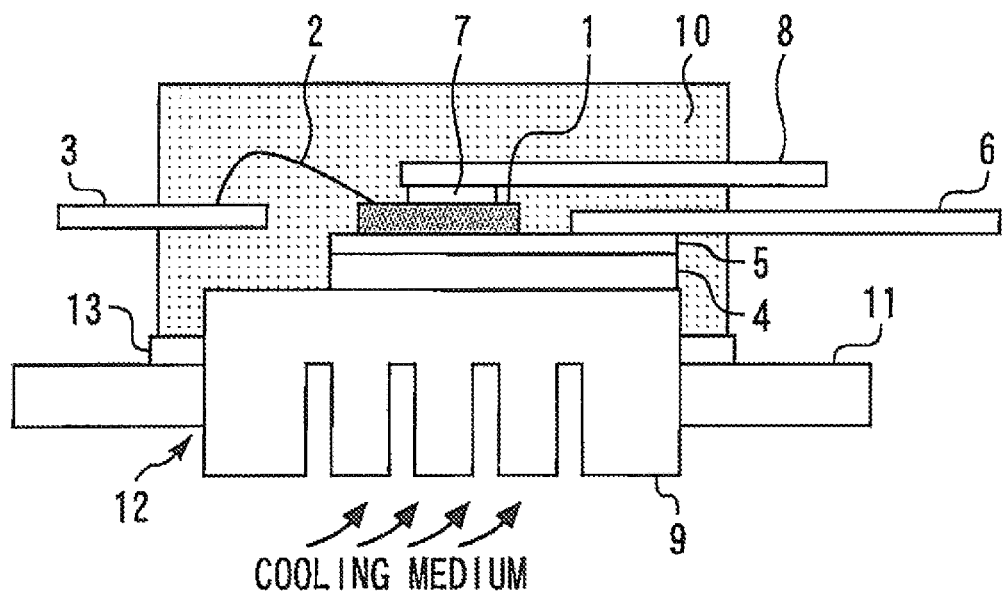
FIG. 1 is a sectional view of a semiconductor device according to Embodiment 1 of the present invention.

FIG. 1 is a sectional view of a semiconductor device according to Embodiment 1 of the present invention. A semiconductor element 1 is a power semiconductor element such as an insulated gate bipolar transistor (IGBT). A control terminal (gate) of the semiconductor element 1 is connected to a signal electrode 3 through a wire 2. A lower surface (collector) of the semiconductor element 1 is connected to a high-voltage electrode 6 through a circuit pattern 5 provided on an insulating plate 4. An upper surface (emitter) of the semiconductor element 1 is connected to a high-voltage electrode 8 through solder 7.

A cooling fin 9 is joined to the lower surface of the semiconductor element 1 through the circuit pattern 5 and the insulating plate 4. Component parts including the semiconductor element 1 are encapsulated (transfer-molded) in a resin 10. A portion of the cooling fin 9 projects from a lower surface of the resin 10. The signal electrode 3 and the high-voltage electrodes 6 and 8 are also led out of the resin 10.

This resin-molded semiconductor package is joined to a cooler 11. The cooler 11 has an opening 12. The cooling fin 9 projecting from the resin 10 is inserted in the opening 12 of the cooler 11. The lower surface of the resin 10 and the cooler 11 are joined to each other by means of a joining material 13 such as an adhesive. The cooler 11 supplies a cooling medium to the cooling fin 9 in the opening 12, thereby cooling the semiconductor element 1 through the cooling fin 9.

Compatibility between the heat conductivity and the strength of joining can be ensured by definitely separating the cooling portion and the joint from each other as described above. For example, even when the semiconductor element 1 performs a high-temperature operation such that the temperature of the cooling portion is increased to a high temperature, the change in temperature of the joint can be limited. Therefore, an SiC semiconductor element provided as a high-temperature operation guaranteed product can be used as the semiconductor element 1. A reduction in the number of component parts and a reduction in weight can also be achieved since there is no need to add structural parts such as screws.

In the conventional device, a heat-conducting material is interposed between the cooling body and the cooler and, therefore, the semiconductor device warps according to the thickness of the heat-conducting material. In the present embodiment, the cooling performance can be secured without being influenced by a warp of the device since the cooling fin 9 is inserted in the opening 12 of the cooler 11.

Also, the provision of the insulating plate 4 between the semiconductor element 1 and the cooling fin 9 enables use of an electrically conductive fluid such as water as cooling medium. The cooling performance can thereby be secured. In a case where the cooling medium is an insulating plate such as air or an insulating fluid, the insulating plate 4 may be removed and the semiconductor element 1 and the circuit pattern 5 may be provided on the cooling fin 9.

Preferably, a surface treatment for increasing the strength of joining to the joining material 13 is performed on the lower surface of the resin 10. For example, a hydrophilization treatment to roughen the joint surface is performed.

Embodiment 2

Figure 2:
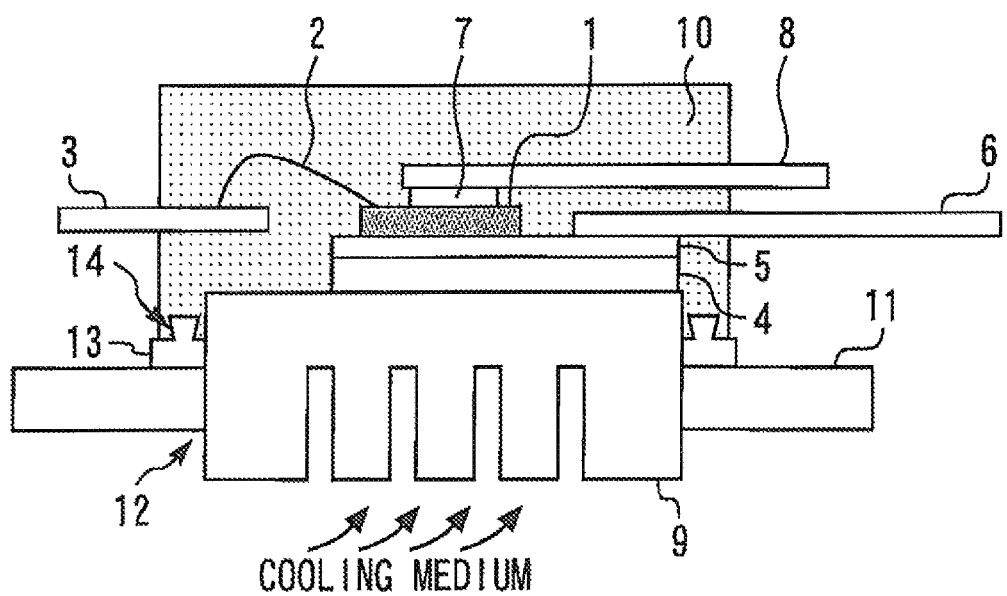
FIG. 2 is a sectional view of a semiconductor device according to Embodiment 2 of the present invention.

FIG. 2 is a sectional view of a semiconductor device according to Embodiment 2 of the present invention. A recess 14 is provided in the lower surface of the resin 10, and the joining material 13 flows round into the recess 14 to form an anchor. The joint area is thereby increased, so that the strength of joining is improved. In other respects, the construction is the same as that in Embodiment 1.

Embodiment 3

FIG. 3 is a sectional view of a semiconductor device according to Embodiment 3 of the present invention. In the present embodiment, the present invention is applied to a double-side cooling structure designed to improve the cooling ability.

A construction described below is added to the construction in Embodiment 1. That is, a cooling fin 15 is joined to the upper surface of the semiconductor element 1 through the high-voltage electrode 8 and an insulating plate 16. A cooler 17 has an opening 18. A portion of the cooling fin 15 projects from an upper surface of the resin 10. The cooling fin 15 projecting from the resin 10 is inserted in the opening 18 of the cooler 17. The upper surface of the resin 10 and the cooler 17 are joined to each other by means of a joining material 19.

The cooling structure provided above the semiconductor element 1 can have the same effect as that of the cooling structure provided below the semiconductor element 1 as described in Embodiment 1. An anchoring structure such as that in Embodiment 2 may be provided in the upper and lower surfaces of the resin 10.

Embodiment 4

FIG. 4 is a sectional view of a semiconductor device according to Embodiment 4 of the present invention. A cooling fin 9 is of a composite structure formed of a ceramic insulating material 20 and an electrically conductive material 21 having high heat conductivity. In other respects, the construction is the same as that in Embodiment 1.

The heat conductivity of the cooling fin 9 can be improved by embedding the electrically conductive material 21 in the insulating material 20 as described above. Since the electrically conductive material 21 is electrically insulated from the semiconductor element 1 by the insulating material 20, the desired insulation can also be ensured.

In a portion inserted in the opening 12 of the cooler 11, the electrically conductive material 21 may be exposed out of the insulating material 20. A composite structure of the cooling fin 9 such as that provided in the present embodiment may also be applied to Embodiments 2 and 3.

DESCRIPTION OF SYMBOLS 1 semiconductor element
4 insulating plate
9 cooling fin (first cooling body)
10 resin
11 cooler (first cooler)
12 opening (first opening)
13 joining material (first joining material)
14 recess
15 cooling fin (second cooling body)
17 cooler (second cooler)
18 opening (second opening)
19 joining material (second joining material)
20 insulating material
21 conductive material

The invention claimed is:

1. A semiconductor device comprising:
a semiconductor element;
a cooling fin joined to the semiconductor element and including a projecting portion having a plurality of recesses;
a resin encapsulating the semiconductor element and having a main surface; and
a cooler having a wall and an opening passing entirely through the wall,
wherein the projecting portion of the cooling fin projects from the main surface of the resin,
the projecting portion of the cooling fin is inserted in the cooler via the opening,
further comprising an adhesive, wherein the adhesive directly contacts both the main surface of the resin and the cooler,
the cooler contains a cooling medium that is supplied to the cooling fin, and
the projecting portion of the cooling fin makes direct contact with the cooling medium inside the cooler.

2. The semiconductor device according to claim 1, further comprising an insulating plate provided between the semiconductor element and the cooling fin.

3. The semiconductor device according to claim 1, wherein the main surface of the resin includes a treated portion that increases a strength of joining of the adhesive.

4. A semiconductor device comprising:
a semiconductor element;
a cooling fin joined to the semiconductor element and including a projecting portion having a plurality of recesses;
a resin encapsulating the semiconductor element and having a main surface; and
a cooler having a wall and an opening passing entirely through the wall,
wherein the projecting portion of the cooling fin projects from the main surface of the resin,
the projecting portion of the cooling fin is inserted in the cooler via the opening,
the main surface of the resin and the cooler are joined to each other by a joining material,
the main surface of the resin is hydrophilic and sufficiently rough so as to increase the strength of the joining material,
the cooler contains a cooling medium that is supplied to the cooling fin, and
the projecting portion of the cooling fin makes direct contact with the cooling medium inside the cooler.

5. A semiconductor device comprising:
a semiconductor element;
a cooling fin joined to the semiconductor element and including a projecting portion having a plurality of recesses;

a resin encapsulating the semiconductor element and having a main surface; and a cooler having a wall and an opening passing entirely through the wall, wherein the projecting portion of the cooling fin projects from the main surface of the resin, the projecting portion of the cooling fin is inserted in the cooler via the opening, the main surface of the resin and the cooler are joined to each other by a joining material, the cooler contains a cooling medium that is supplied to the cooling fin, the projecting portion of the cooling fin makes direct contact with the cooling medium inside the cooler, and a recess is provided in the main surface of the resin, and the joining material flows round into the recess to form an anchor.

6. The semiconductor device according to claim 1, wherein the cooling fin includes a first cooling fin jointed to a lower surface of the semiconductor element and a second cooling fin jointed to an upper surface of the semiconductor element, the first cooling fin includes a first projecting portion having a plurality of recesses, the second cooling fin includes a second projecting portion having a plurality of recesses, the main surface of the resin includes a lower surface and an upper surface of the resin, the cooler includes a first cooler having a first opening and a second cooler having a second opening, the first projecting portion of the first cooling fin projects from the lower surface of the resin, the second projecting portion of the second cooling fin projects from the upper surface of the resin, the first projecting portion of the first cooling fin is inserted in the first cooler via the first opening, the second projecting portion of the second cooling fin is inserted in the second cooler via the second opening, the lower surface of the resin and the first cooler are joined to each other by a first adhesive, and the upper surface of the resin and the second cooler are joined to each other by a second adhesive.

7. The semiconductor device according to claim 1, wherein the cooling fin is of a composite structure formed of an insulating material and a conductive material.

* * * * *